(12) United States Patent
Fuderer et al.

(10) Patent No.: US 8,866,476 B2
(45) Date of Patent: Oct. 21, 2014

(54) MR IMAGING USING PARALLEL SIGNAL ACQUISITION

(75) Inventors: Miha Fuderer, Eindhoven (NL); Johannes Martinus Peeters, Eindhoven (NL); Thomas Hendrik Rozijn, Eindhoven (NL); Adrianus Joseph Willibrordus Duijndam, Eindhoven (NL); Michel Paul Jurriaan Jurrissen, Eindhoven (NL); Franciscus Johannes Maria Benschop, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 455 days.

(21) Appl. No.: 13/254,466

(22) PCT Filed: Mar. 22, 2010

(86) PCT No.: PCT/IB2010/051217
§ 371 (c)(1),
(2), (4) Date: Sep. 2, 2011

(87) PCT Pub. No.: WO2010/109394
PCT Pub. Date: Sep. 30, 2010

(65) Prior Publication Data
US 2012/0001633 A1    Jan. 5, 2012

(30) Foreign Application Priority Data

Mar. 25, 2009   (EP) .................................... 09156094

(51) Int. Cl.
*G01V 3/00* (2006.01)
*G01R 33/561* (2006.01)
*G01R 33/54* (2006.01)

(52) U.S. Cl.
CPC .......... *G01R 33/5611* (2013.01); *G01R 33/543* (2013.01)
USPC .......................................... 324/309; 324/307

(58) Field of Classification Search
USPC ........................... 324/309, 307, 306, 303, 300
See application file for complete search history.

(56) References Cited

U.S. PATENT DOCUMENTS 5,933,006 A  *  8/1999  Rasche et al. ................. 324/307
(Continued)

FOREIGN PATENT DOCUMENTS

EP    1500368 A1    1/2005

OTHER PUBLICATIONS

Mueller, S., et al.; Dynamic Coil Selection for Real-Time Imaging in Interventional MRI; 2006; MRM; 56:1156-1162.
Murakami, J. W., et al.; Intensity Correction of Phased-Array Surface Coil Images; 1996; MRM; 35:585-590.
(Continued)

*Primary Examiner* — Louis Arana

(57) ABSTRACT

The invention relates to a method of MR imaging of at least a portion of a body (10) of a patient placed in an examination volume of an MR device (1). The object of the invention is to provide an improved, i.e. faster, parallel imaging technique. The invention proposes to acquire a survey signal data set (21, 22) at a low image resolution, which survey signal data set (21, 22) includes MR signals received in parallel or successively via a volume RF coil (9) and via a set of array RF coils (11, 12, 13). Spatial sensitivity profiles (23) of the array RF coils (11, 12, 13) are determined from the low resolution data. As a next step, a reference scan is performed in which a reference signal data set (25) is acquired at intermediate resolution solely via the array RF coils (11, 12, 13). The spatial sensitivity profiles (27) of the array RF coils (11, 12, 13) are determined from the data acquired at intermediate resolution and from the spatial sensitivity profiles (23) determined before at low resolution. Finally, a diagnostic scan is performed, in which a diagnostic signal data set (29) is acquired in parallel via the array RF coils (11, 12, 13) at high resolution. The diagnostic signal data set (29) may be acquired in a sub-sampled fashion. A diagnostic MR image (30) is then reconstructed from the diagnostic signal data set (29) and from the spatial sensitivity profiles (27) determined at the intermediate resolution, for example by using the SENSE or SMASH algorithm.

10 Claims, 2 Drawing Sheets

(56) References Cited

U.S. PATENT DOCUMENTS

| | | |
|---|---|---|
| 6,559,642 B2 | 5/2003 | King |
| 6,600,315 B1 * | 7/2003 | Heaton et al. ............. 324/303 |
| 6,680,610 B1 | 1/2004 | Kyriakos et al. |
| 6,777,934 B2 | 8/2004 | Takahashi et al. |
| 6,876,201 B2 | 4/2005 | Takizawa et al. |
| 6,919,722 B2 | 7/2005 | Angelos et al. |
| 6,922,055 B1 * | 7/2005 | Damadian et al. ............ 324/318 |
| 7,289,841 B2 * | 10/2007 | Johnson et al. ............... 600/431 |
| 2003/0228043 A1 | 12/2003 | Ikezaki |

OTHER PUBLICATIONS

Pruessmann, K. P., et al.; SENSE: Sensitivity Encoding for Fast MRI; 1999; MRM; 42:952-962.

Schmidt, C. F., et al.; Sensitivity-encoded (SENSE) echo planar fMRI at 3T in the medial temporal lobe; 2005; NeuroImage; 25:625-641.

Sodickson, D. K., et al.; Simultaneous Acquisition of Spatial Harmonics (SMASH): Fast Imaging with Radiofrequency Coil Arrays; 1997; MRM; 38:591-603.

Sodickson, D. K., et al.; A generalized approach to parallel magnetic resonance imaging; 2001; Med. Phys.; 28(8) 1629-1643.

* cited by examiner

MR IMAGING USING PARALLEL SIGNAL ACQUISITION

FIELD OF THE INVENTION

The invention relates to the field of magnetic resonance (MR) imaging. It concerns a method of MR imaging of at least a portion of a body of a patient placed in an examination volume of an MR device. The invention also relates to an MR device and to a computer program to be run on an MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils. In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to an MR image by means of Fourier transformation.

Recently techniques for accelerating MR acquisition have been developed which are called parallel acquisition. Methods in this category are SENSE (Pruessmann et al., "SENSE: Sensitivity Encoding for Fast MRI", Magnetic Resonance in Medicine 1999, 42 (5), 1952-1962) and SMASH (Sodickson et al., "Simultaneous acquisition of spatial harmonics (SMASH): Fast imaging with radiofrequency coil arrays", Magnetic Resonance in Medicine 1997, 38, 591-603). SENSE and SMASH use undersampled k-space data acquisition obtained from multiple RF receiving coils in parallel. In these methods, the (complex) signal data from the multiple coils are combined with complex weightings in such a way as to suppress undersampling artifacts (aliasing) in the finally reconstructed MR images. This type of complex array combining is sometimes referred to as spatial filtering, and includes combining which is performed in the k-space domain (as in SMASH) or in the image domain (as in SENSE), as well as methods which are hybrids. In either SENSE or SMASH, it is essential to know the proper weightings or sensitivities of the coils with high accuracy. To obtain the coil sensitivities, i.e. the spatial sensitivity profiles of the array RF coils used for signal detection, a calibration pre-scan is typically performed prior to and/or after the actual image acquisition. In the pre-scan, which is also sometimes referred to as reference scan, the MR signals are usually acquired at a resolution which is significantly lower than the resolution required for the final diagnostic MR image. The low-resolution reference scan consists of an interleaving of signal acquisition via the array RF coils and via a reference coil, usually a volume coil, for example the quadrature body coil of the MR apparatus. Low resolution MR images are reconstructed from the MR signals received via the array RF coils and via the volume RF coil. The coil sensitivities, i.e. the spatial sensitivity profiles of the array RF coils, are then computed by division of the array coil images by the volume coil image.

SUMMARY OF THE INVENTION

A drawback of the known approach is that the acquisition time of the reference scan is rather long. In a typical application it requires about 30 seconds. This is partly due to the interleaving scheme of signal acquisition via the volume RF coil and via the array RF coils. A further issue is that extra averaging is required to obtain a sufficient signal-to-noise ratio for the volume RF coil, since the volume RF coil is significantly less sensitive than the array RF coils, which are usually surface coils.

From the foregoing it is readily appreciated that there is a need for an improved parallel MR imaging technique. It is consequently an object of the invention to enable faster reference scanning for determination of the spatial sensitivity profiles of the array RF coils used in parallel MR imaging.

In accordance with the invention, a method of MR imaging of at least a portion of a body of a patient placed in an examination volume of a MR device is disclosed. The method of the invention comprises the following steps:

subjecting the portion of the body to a first imaging sequence for acquiring a survey signal data set, which survey signal data set includes MR signals received in parallel or successively via a volume RF coil having an essentially homogeneous spatial sensitivity profile within the examination volume, and a set of at least two array RF coils having different spatial sensitivity profiles within the examination volume, wherein the first imaging sequence comprises RF pulses and switched magnetic field gradients controlled in such a manner that the survey signal data set is acquired at a first image resolution;

subjecting the portion of the body to a second imaging sequence for acquiring a reference signal data set, which reference signal data set includes MR signals received in parallel via the array RF coils, wherein the second imaging sequence comprises RF pulses and switched magnetic field gradients controlled in such a manner that the reference signal data set is acquired at a second image resolution, which is higher than the first image resolution;

subjecting the portion of the body to a third imaging sequence for acquiring a diagnostic signal data set, which diagnostic signal data set includes MR signals received in parallel via at least a subset of the set of array RF coils, wherein the third imaging sequence comprises RF pulses and switched magnetic field gradients controlled in such a manner that the diagnostic signal data set is acquired at a third image resolution, which is higher than the second image resolution; and reconstructing a diagnostic MR image from a combination of the diagnostic signal data set, the survey signal data set, and the reference signal data set.

The gist of the invention is that rather than applying two different scans as in conventional parallel imaging, i.e. the reference scan and the actual diagnostic scan, three different scans are applied. The first scan, which can be called survey scan, is of significantly lower resolution than the resolution of the conventionally applied reference scan and may consist of an interleaved scanning via the volume RF coil and the set of array RF coils. During the first and second scans individual signal data sets are acquired on a per coil basis, i.e. one signal data set is acquired for each coil. The second scan is very similar to the conventional reference scan. However, during the second scan MR signals are received exclusively in parallel via the array RF coils. No MR signals are received via the volume RF coil. Therefore, significantly less averaging can be applied in order to speed up the acquisition. The third scan is the actual diagnostic scan. Further subsequent diagnostic scans may follow.

The spatial sensitivity profiles of the array RF coils may be determined in accordance with the invention at the second image resolution from a combination of the survey signal data set and the reference signal data set. The diagnostic MR image can then be reconstructed from the diagnostic signal data set and from the spatial sensitivity profiles determined at the second resolution. According to a preferred embodiment of the invention, the spatial sensitivity profiles of the array RF coils are firstly determined from the MR signals received during the survey scan, i.e. at the low resolution of the survey images. This low resolution would be insufficient for reconstruction of diagnostic MR images, for example by application of the SENSE or SMASH algorithm. For this reason, the resolution of the spatial sensitivity profiles is enhanced after the second scan. The spatial sensitivity profiles of the array RF coils are determined at the intermediate resolution, i.e. the second image resolution, from a combination of the set of reference images acquired during the second scan and the spatial sensitivity profiles determined at the low resolution from the MR signals acquired during the first scan. This enhanced resolution of the spatial sensitivity profiles of the array RF coils is sufficient for reconstruction of diagnostic images.

More specifically, the method of the invention may comprise the following steps:

a) acquiring the survey signal data set;

b) reconstructing a set of survey images at the first image resolution from the survey signal data set;

c) determining the spatial sensitivity profiles of the array RF coils at the first resolution by comparing the images of the set of survey images;

d) acquiring the reference signal data set;

e) reconstructing a set of reference images at the second image resolution from the reference signal data set;

f) determining the spatial sensitivity profiles of the array RF coils at the second image resolution from a combination of the set of reference images and the spatial sensitivity profiles determined at the first resolution;

g) acquiring the diagnostic signal data set; and h) reconstructing a diagnostic MR image from the diagnostic signal data set and from the spatial sensitivity profiles determined at the second resolution.

The approach of the invention has several advantages:

The total acquisition time required is significantly reduced. The survey scan has significantly lower resolution than the conventional reference scan, which results in a corresponding reduction of acquisition time and which also allows less averaging. In practice, the survey scan can be typically 16 times faster than the conventional reference scan as used in SENSE or SMASH imaging. Consequently, the typical duration of the survey scan in accordance with the invention is about 2 seconds. The subsequent second scan is also significantly faster than the conventional reference scan, since no signal acquisition via the volume RF coil and, consequently, less averaging is required. The total duration of the survey scan (step a) and the subsequent reference scan (step d) in accordance with the invention is only a few seconds rather than some thirty seconds like in the conventional reference scanning approach. A further advantage of the invention is that whenever there is slight motion of the examined patient relative to the RF coils used for signal acquisition, the reference scan, i.e. the second scan (step d) can be repeated, without an unreasonable extra time burden. Usually, a re-acquisition of the survey scan is not required. It turns out that slightly outdated survey signal data do not result in significant image artifacts in the finally reconstructed diagnostic MR images.

A further advantage of the short acquisition time of the pre-scans according to the invention is that these scans are short enough to make them unnoticeable for the user. So the pre-scans do not have to appear in the user interface of the MR apparatus. In this way, the pre-scans are perceived by the user only as preparation phases and not as time-consuming and, therefore, undesirable extra scans.

A further issue in conventional parallel MR imaging approaches is that sometimes the set of array RF coils comprises a very large number of single coil elements from which only a subset is to be used for the respective imaging task. Usually MR signals are acquired and processed via all of the coil elements in the conventional approach because the user is unable to predict which coil elements are expected to contribute to the MR image to be acquired and which are not. The subset of the set of array coils used in step g) can advantageously be determined by the method of the invention by automatically selecting only array coils, via which MR signal intensity above a given threshold level is detected in steps a) (first scan) or d) (second scan). Those coil elements of the set of array coils can be excluded during signals acquisition in step g) that contribute negligible signal amplitude in steps a) or d). In this way, less resources in terms of bandwidth, storage capacity and reconstruction processing are required for all subsequent scanning. The survey scan (step a) and/or the reference scan (step d) may be acquired with the full number of coil elements. But since these scans are short enough the requirements with regard to the resources of the MR system are still moderate.

An alternative or additional approach in this context is an automatic reduction of the effective number of coil elements during image processing by application of the so-called array-compression technique. In the array-compression technique linear combinations of the diagnostic signal data acquired via different coils are computed before image reconstruction. In this way, the effective number of coil elements is reduced which saves computation time and reconstruction memory usage. The combination factors can automatically be derived in accordance with the invention from the data of the survey and/or reference scans. In other words, rather than selecting a subset of array coils, the signal data of the array coils are pre-combined in order to lower the effective number of coil elements during image processing. The pre-combination (or array-compression) factors are determined in a straight-forward manner from the survey and/or reference scan data.

According to a preferred embodiment of the invention, the field of view of the survey and reference signal data sets is selected to be larger than the field of view of the diagnostic signal data set. In this way, the pre-scans, i.e. the first and second scans, can be used for several diagnostic scans that are positioned somewhere within the large field of view of the pre-scans. So a set of diagnostic scans with different geometric positions of the field of view can share the signal data of the same survey and reference scans for image reconstruction, provided that the survey and reference scans are performed with a sufficient field of view.

The method of the invention described thus far can be carried out by means of an MR device including at least one main magnet coil for generating a uniform steady magnetic field within an examination volume, a number of gradient coils for generating switched magnetic field gradients in different spatial directions within the examination volume, at least one volume RF coil which has an essentially homogeneous spatial sensitivity profile, for generating RF pulses within the examination volume and/or for receiving MR signals from a body of a patient positioned in the examination volume, a set of array RF coils for receiving MR signals from the body in parallel, the array RF coils having different spatial sensitivity profiles, a control unit for controlling the temporal succession of RF pulses and switched magnetic field gradients, a reconstruction unit, and a visualization unit. The method of the invention is implemented by a corresponding programming of the reconstruction unit, the visualization unit, and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings:

With reference to FIG. 1, an MR device 1 is shown. The device comprises superconducting or resistive main magnet coils 2 such that a substantially uniform, temporally constant main magnetic field is created along a z-axis through an examination volume.

DETAILED DESCRIPTION

Figure 1:
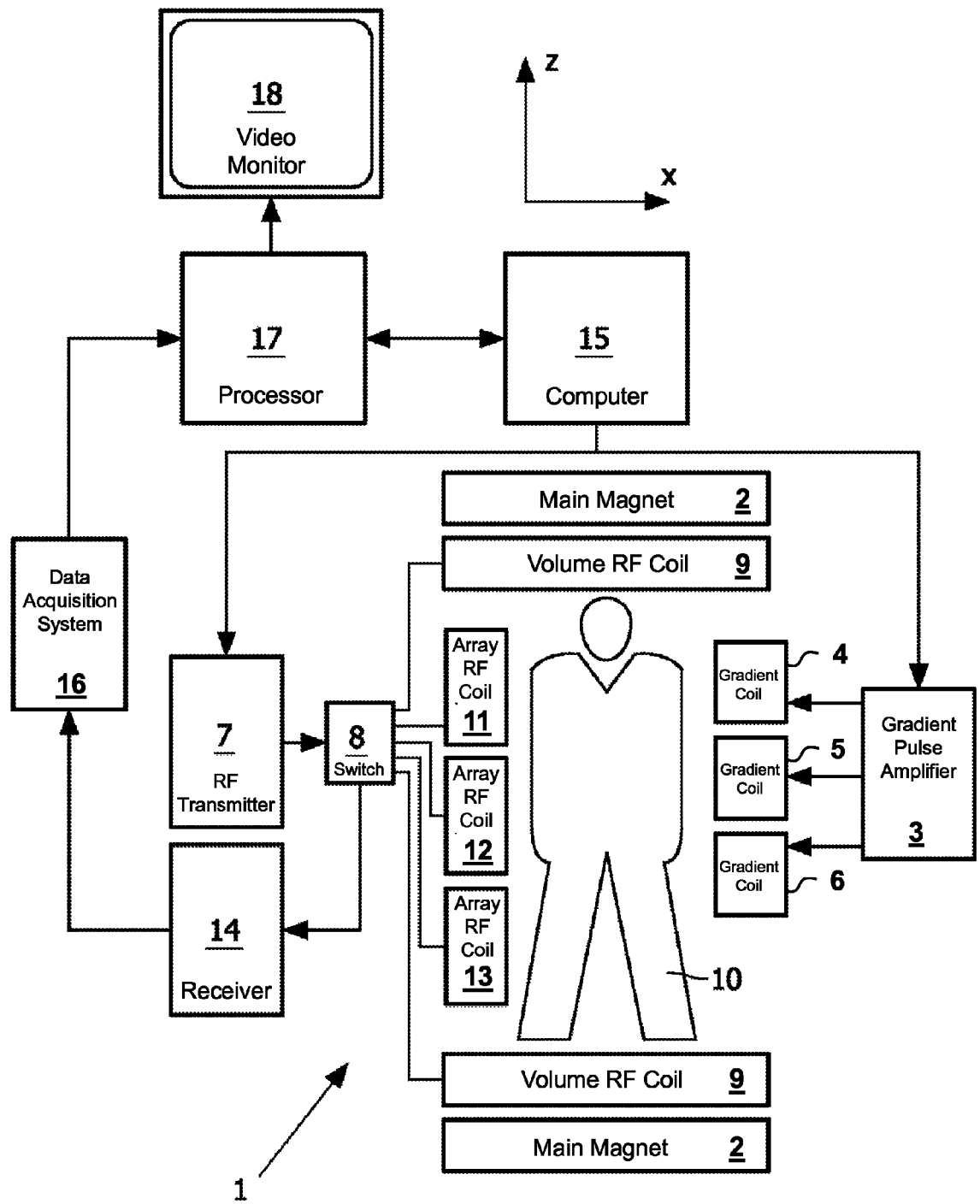
FIG. 1 shows an MR device for carrying out the method of the invention.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9. For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
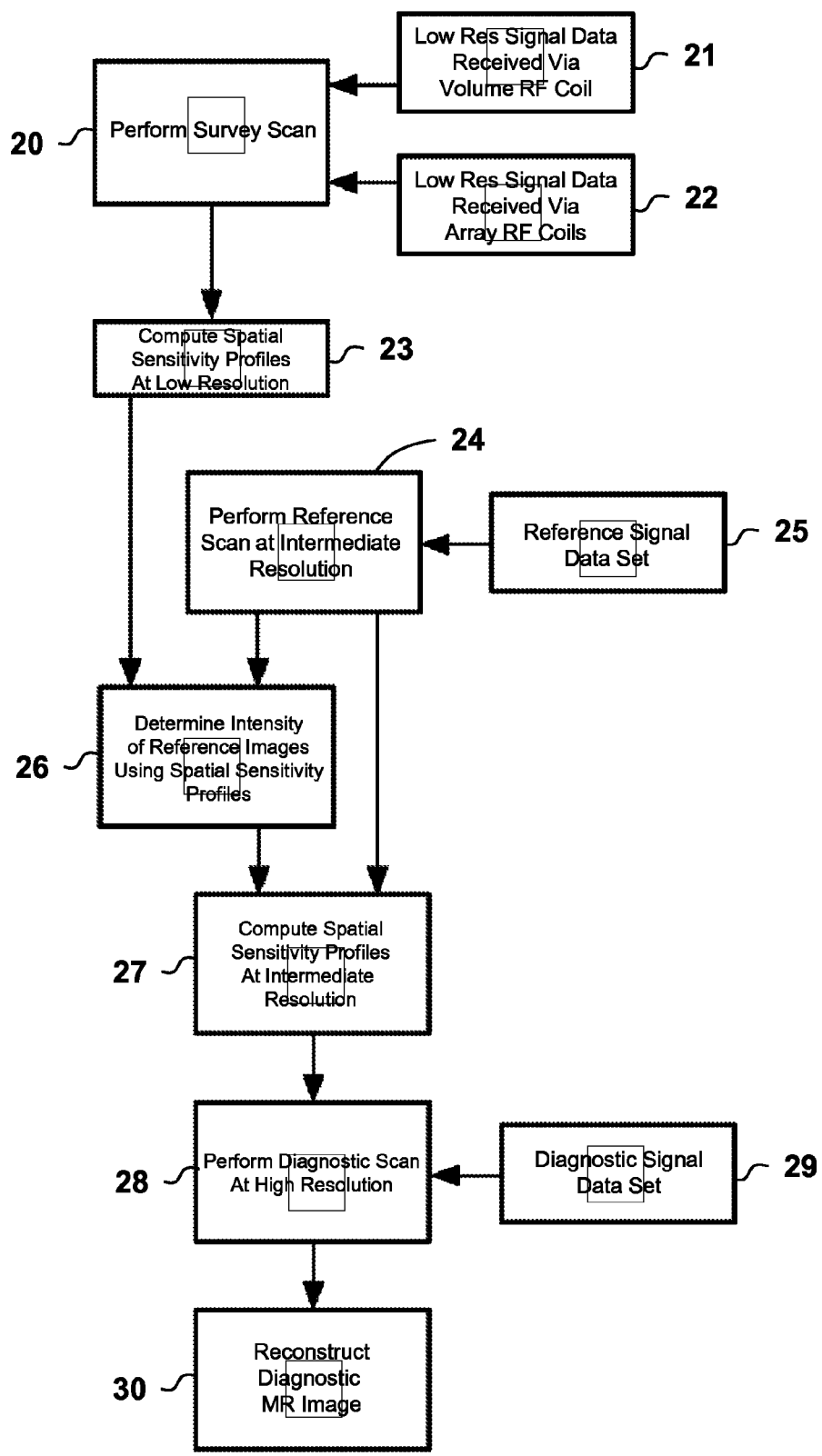
FIG. 2 shows a flow chart illustrating the method of the invention.

With continuing reference to FIG. 1 and with further reference to FIG. 2, an embodiment of the imaging approach of the invention is explained. Each diagnostic imaging scan with SENSE or SMASH reconstruction is preceded by the combination of a survey scan and a reference scan, as explained above.

In step 20 the survey scan is performed, during which a survey signal data set is received in parallel via the set of array RF coils 11, 12, 13 and, in an interleaving fashion, via the volume RF coil 9. The signal data received at a first image resolution, which is a low resolution, via the volume RF coil 9 is designated by 21, while the signal data received via the set of array RF coils 11, 12, 13 is designated by 22. From the survey signal data set 21, 22 acquired in this way, a set of survey images is reconstructed at the low image resolution, which means that one survey image is reconstructed from the survey signal data received via the volume RF coil 9 and from the signal data received via each of the array RF coils 11, 12, 13. Spatial sensitivity profiles 23 of the array RF coils 11, 12, 13 at the low resolution of the survey scan are then computed by dividing the survey images of the array RF coils 11, 12, 13 by the survey image of the volume RF coil 9.

In step 24, the reference scan is performed at an intermediate resolution, which is higher than the low resolution of the survey scan. During the reference scan a reference signal data set 25 is received in parallel exclusively via the array RF coils 11, 12, 13. The volume RF coil 9 is not used during the reference scan. Reference images are reconstructed from the reference signal data set 25 at the intermediate resolution of the reference scan for each array RF coil 11, 12, 13. In step 26, an intensity correction of the set of reference images according to the spatial sensitivity profiles 23 determined at the low resolution of the survey scan is performed. In this way, intensity variations in the reference images due to the different spatial sensitivity profiles of the array RF coils 11, 12, 13 are compensated for. From the intensity corrected reference images a "reference-coil-like" image is obtained at the intermediate resolution, for example by (weighted) superposition of the intensity corrected reference images. This "reference-coil-like" image, which essentially emulates a reference MR image acquired via the volume RF coil 9 at the intermediate resolution of the reference scan, is then used to compute spatial sensitivity profiles 27 of the array coils 11, 12, 13 at the intermediate resolution. This is achieved by dividing the uncorrected reference images associated with the array coils 11, 12, 13 by the "reference-coil-like" image.

In step 28 a diagnostic scan is performed at high resolution. During the diagnostic scan a diagnostic signal data set 29 is acquired again exclusively via the set of array RF coils 11, 12, 13. A diagnostic MR image 30 is reconstructed, by using the SENSE or SMASH algorithm, from the diagnostic signal data set 29 and from the spatial sensitivity profiles 27 computed in the preceding steps. Further diagnostic scans may follow from which further diagnostic MR images are reconstructed using the same spatial sensitivity profiles 27.

The invention claimed is:

1. A method of magnetic resonance (MR) imaging of at least a portion of a body of a patient placed in an examination volume of an MR imaging device, the method comprising:
    subjecting the portion of the body to a first imaging sequence for acquiring a survey signal data set, which survey signal data set includes MR signals received in parallel or successively via a volume RF coil having an essentially homogeneous spatial sensitivity profile within the examination volume, and a set of at least two array RF coils having different spatial sensitivity profiles within the examination volume, wherein the first imaging sequence comprises RF pulses and switched magnetic field gradients controlled in such a manner that the survey signal data set is acquired at a first image resolution;
    subjecting the portion of the body to a second imaging sequence for acquiring a reference signal data set, which reference signal data set includes MR signals received in parallel via the array RF coils, wherein the second imaging sequence comprises RF pulses and switched magnetic field gradients controlled in such a manner that the reference signal data set is acquired at a second image resolution, which is higher than the first image resolution;
    subjecting the portion of the body to a third imaging sequence for acquiring a diagnostic signal data set, which diagnostic signal data set includes MR signals received in parallel via at least a subset of the set of array RF coils, wherein the third imaging sequence comprises RF pulses and switched magnetic field gradients controlled in such a manner that the diagnostic signal data set is acquired at a third image resolution, which is higher than the second image resolution; and
    reconstructing a diagnostic MR image from a combination of the diagnostic signal data set, the survey signal data set, and the reference signal data set and wherein spatial sensitivity profiles of the array RF coils are determined at the second image resolution from a combination of the survey signal data set and the reference signal data set, the diagnostic MR image being reconstructed from the diagnostic signal data set and from the spatial sensitivity profiles determined at the second resolution.

2. The method of claim 1, the method comprising:
    acquiring the survey signal data set;
    reconstructing a set of survey images at the first image resolution from the survey signal data set;
    determining the spatial sensitivity profiles of the array RF coils at the first resolution by comparing the images of the set of survey images;
    acquiring the reference signal data set;
    reconstructing a set of reference images at the second image resolution from the reference signal data set;
    determining the spatial sensitivity profiles of the array RF coils at the second image resolution from a combination of the set of reference images and the spatial sensitivity profiles determined at the first resolution;
    acquiring the diagnostic signal data set; and
    reconstructing a diagnostic MR image from the diagnostic signal data set and from the spatial sensitivity profiles determined at the second resolution.

3. The method of claim 2, wherein the spatial sensitivity profiles of the array coils at the second image resolution are determined by
    intensity correction of the set of reference images according to the spatial sensitivity profiles determined at the first resolution;
    dividing the uncorrected data of the set of reference images by the intensity corrected data.

4. The method of claim 1, wherein the diagnostic signal data set is acquired by sub-sampling of k-space, the diagnostic MR image being reconstructed by using the SENSE or SMASH algorithm.

5. The method of claim 1, wherein the subset of the set of array coils used for acquisition of the diagnostic signal data set is determined by automatically selecting only array coils, via which MR signal intensity above a given threshold level has been detected during acquisition of the survey signal data set or reference signal data set.

6. The method of claim 1, wherein the field of view of the survey and reference signal data sets is larger than the field of view of the diagnostic signal data set.

7. A magnetic resonance (MR) imaging device for MR imaging of at least a portion of a body of a patient placed in a examination volume of the MR imaging device, the MR imaging device comprising:
at least one main magnet coil for generating a uniform, steady magnetic field within an examination volume;
a plurality of gradient coils for generating switched magnetic field gradients in different spatial directions within the examination volume;
at least one volume RF coil, which has an essentially homogeneous spatial sensitivity profile, for generating RF pulses within the examination volume and/or for receiving MR signals from the body of the patient positioned in the examination volume;
a set of array RF coils for receiving MR signals from the body in parallel, the array RF coils having different spatial sensitivity profiles;
a control unit for controlling the temporal succession of RF pulses and switched magnetic field gradients;
a reconstruction unit; and
a visualization unit,
wherein the MR imaging device is arranged to:
subject the body to a first imaging sequence for acquiring a survey signal data set, which survey signal data set includes MR signals received in parallel or successively via the volume RF coil and via the set of array RF coils, wherein the first imaging sequence comprises RF pulses, generated via the volume RF coil, and switched magnetic field gradients, generated via the gradient coils, controlled in such a manner that the survey signal data set is acquired at a first image resolution,
subject the portion of the body to a second imaging sequence for acquiring a reference signal data set, which reference signal data set includes MR signals received in parallel via the array RF coils, wherein the second imaging sequence comprises RF pulses and switched magnetic field gradients controlled in such a manner that the reference signal data set is acquired at a second image resolution, which is higher than the first image resolution; subjecting the portion of the body a third imaging sequence for acquiring a diagnostic signal data set, which diagnostic signal data set includes MR signals received in parallel via at least a subset of the set of array RF coils, wherein the third imaging sequence comprises RF pulses and switched magnetic field gradients controlled in such a manner that the diagnostic signal data set is acquired at a third image resolution, which is higher than the second image resolution, and
determine the spatial sensitivity profiles of the array RF coils at the second image resolution from a combination of the survey signal data set and the reference signal data set, and reconstructing the diagnostic MR image from the diagnostic signal data set and from the spatial sensitivity profiles determined at the second resolution.

8. The MR imaging of claim 7, wherein the volume RF coil is a quadrature body coil.

9. The MR imaging device of claim 7, wherein the array RF coils are surface coils.

10. A non-transitory computer readable medium have stored therein instructions executable by a processor for causing a magnetic resonance (MR) imaging device to:
acquire a survey signal data set at a first image resolution, which survey signal data set includes MR signals received in parallel or successively via a volume RF coil having an essentially homogeneous spatial sensitivity profile within an examination volume of the MR imaging device, and a set of at least two array RF coils having different spatial sensitivity profiles within the examination volume;
acquire a reference signal data set at a second image resolution, which is higher than the first image resolution, which reference signal data set includes MR signals received in parallel via the array RF coils,
acquire a diagnostic signal data set at a third image resolution, which is higher than the second image resolution, which diagnostic signal data set includes MR signals received in parallel via at least a subset of the set of array RF coils; and
reconstruct a diagnostic MR image of at least a portion of a body of a patient placed in the examination volume from a combination of the diagnostic signal data set, the survey signal data set, and the reference signal data set,
wherein spatial sensitivity profiles of the array RF coils are determined at the second image resolution from a combination of the survey signal data set and the reference signal data set, the diagnostic MR image being reconstructed from the diagnostic signal data set and from the spatial sensitivity profiles determined at the second resolution.

* * * * *